(12) United States Patent  (10) Patent No.:     US 7,447,975 B2
Riley  (45) Date of Patent:     Nov. 4, 2008

(54) SUPPORTING CYCLIC REDUNDANCY CHECKING FOR PCI-X

(75) Inventor: Dwight D. Riley, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 463 days.

(21) Appl. No.: 10/243,995

(22) Filed: Sep. 12, 2002

(65) Prior Publication Data

US 2004/0054955 A1     Mar. 18, 2004

(51) Int. Cl.
*H03M 13/00*     (2006.01)
(52) U.S. Cl. .................................. 714/758; 710/705
(58) Field of Classification Search .................. 714/755, 714/723, 758, 5; 710/104, 105
See application file for complete search history.

(56) References Cited

U.S. PATENT DOCUMENTS

| 5,177,747 | A  | * | 1/1993  | Capps et al. ................. 714/805 |
| 5,959,914 | A  | * | 9/1999  | Gates et al. .................. 365/201 |
| 6,000,040 | A  | * | 12/1999 | Culley et al. ................... 714/31 |
| 6,161,157 | A  | * | 12/2000 | Tripathi et al. ............... 710/109 |
| 6,185,697 | B1 | * | 2/2001  | Shiraishi ......................... 714/6 |
| 6,240,522 | B1 | * | 5/2001  | Stufflebeam ................. 713/324 |
| 6,591,310 | B1 | * | 7/2003  | Johnson .......................... 710/3 |
| 6,671,832 | B1 | * | 12/2003 | Apisdorf ....................... 714/52 |
| 6,801,970 | B2 | * | 10/2004 | Riley et al. .................. 710/105 |
| 6,915,446 | B2 | * | 7/2005  | Riley .............................. 714/5 |

* cited by examiner

*Primary Examiner*—Mujtaba K Chaudry

(57) ABSTRACT

A cyclic redundancy check (CRC) mechanism for the extensions (PCI-X) to the Peripheral Component Interconnect (PCI) bus system used in computer systems is fully backward compatible with the full PCI-X protocol. CRC check-bits are inserted to provide error detection capability for the header address and attribute phases, and for burst and DWORD transaction data phases. The CRC check-bits are inserted into unused attribute or clock (or target response) phases, or into reserved or reserved drive high portions (bits) of the address/ data (AD), command/byte enable (C/BE#), or into the parity lanes of the PCI-X phases.

40 Claims, 8 Drawing Sheets

US 7,447,975 B2

SUPPORTING CYCLIC REDUNDANCY CHECKING FOR PCI-X

CROSS-REFERENCE TO RELATED APPLICATIONS

Not applicable.

STATEMENT REGARDING FEDERALLY SPONSORED RESEARCH

Not applicable.

BACKGROUND OF THE INVENTION

1. Field of the Invention

The present invention is related to error detection in computer systems, and more particularly, supporting error detection on the high-performance extension (PCI-X) to the peripheral component interconnect (PCI) computer system bus, improving PCI-X error detection capabilities.

2. Description of the Related Art

Today, PCI has limited support to detect and recover from parity exceptions. If a parity error is detected on PCI, the system typically will crash. Prior solutions do not provide for any fault tolerance mechanism. There is a need for enhancing PCI-X to update PCI to a modem switched-type interconnect.

SUMMARY OF THE INVENTION

Embodiments of the present invention provide a cyclic redundancy checking (CRC) error detection mechanism, without using any sideband signals, to the extensions (PCI-X) to the Peripheral Component Interconnect (PCI) bus system used in computer systems that are fully backward compatible with the PCI-X system architecture. Cyclic redundancy code check-bits are inserted into unused or reserved fields covering (i.e., used for correcting) either the transaction header information (the address phase and the attribute phases) or the data information (one or more data phases for block burst or a single data phase for DWORD transactions). For CRC coverage of the transaction header information, the unused attribute fields (usually reserved drive high or "RDH") and/or the undefined AD bus (i.e., the clock after the attribute phase) can be used to carry the CRC check-bits. For coverage of the data phase of either 64-bit or 32-bit block transactions, the currently reserved C/BE# lanes can be used to carry up to 32-bits of CRC check-bits. For DWORD transactions, up to 32-bit CRC check-bits can be allocated.

Embodiments of the present invention feature a technique, in a computer system, for providing CRC for PCI-X. According to the technique, a plurality of PCI-X phases is created in the computer system, and a fully backward compatible mechanism is provided for inserting cyclic redundancy code into unused portions or inserted on parity signals of the plurality of PCI-X phases. The CRC improves error detection for PCI-X beyond parity.

DETAILED DESCRIPTION OF INVENTION

PCI-X is described in the *PCI-X Addendum to the PCI Local Bus Specification, Revision* 1.0 (the PCI-X specification) and in U.S. Pat. No. 6,266,731 B1 to Riley et al., entitled "High Speed Peripheral Interconnect Apparatus, Method and System," which are incorporated by reference herein in their entireties. PCI is described in the *PCI Local Bus Specification, Revision* 2.2 (the general PCI specification), which also is incorporated by reference herein in its entirety. When PCI is mentioned herein, it is meant to include all of PCI, including PCI-X. If PCI bus, the bus operating in PCI mode, or PCI device is mentioned herein, it are meant to include PCI-X. Full PCI protocol refers to the PCI protocol that includes PCI-X.

Figure 1:
FIG. 1 illustrates all (32-bit and 64-bit) prior art transaction phases for PCI-X showing the AD and the C/BE# lanes.
Figure 1:
Figure 1:
Figure 1:
Figure 1:
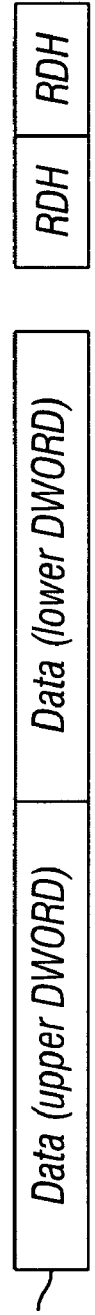
Figure 1:

Embodiments of the present invention provide a technique of enhancing PCI-X error detection capability by adding cyclic redundancy checking (CRC) code support without the need for any additional pins. A CRC protected transaction that experiences an exception fault must be rescheduled and replayed for error recovery. FIG. 1 illustrates all (32-bit and 64-bit) prior art transaction phases for PCI-X, showing the address/data (AD) lanes, the command/byte enable (C/BE#) lanes, and the unused reserved drive high (RDH) bits therein. With the introduction of the PCI-X extension to PCI and its use of block transfers that move data in a contiguous sequential fashion, the reserved C/BE# lanes are available for other functions, as will be described below.

PCI-X is supported by initiator and target devices that are permitted to disconnect burst transactions only on allowable disconnect boundaries (ADBs). An ADB is a naturally aligned 128-byte address, i.e., an address whose lower seven bits are zeros. After a burst data transfer starts and the target signals that it will accept more than a single data phase, the transaction can only be stopped by a target or initiator disconnection at an ADB, when the transaction byte count is satisfied, or by a Target-Abort. When an initiator terminates a transaction, it signals the end of the transaction one clock before the last data phase. An ADB delimited quanta (ADQ) is a portion (or all) of a transaction or a buffer that fits between two adjacent ADBs. For example, if a transaction starts between two ADBs, crosses one ADB, and ends before reaching the next ADB, the transaction includes two ADQ of data. Such a transaction fits in two buffers inside a device that divides its buffers on ADBs. The minimum buffer size that both the initiator and target must use is 128-bytes.

Figure 2:
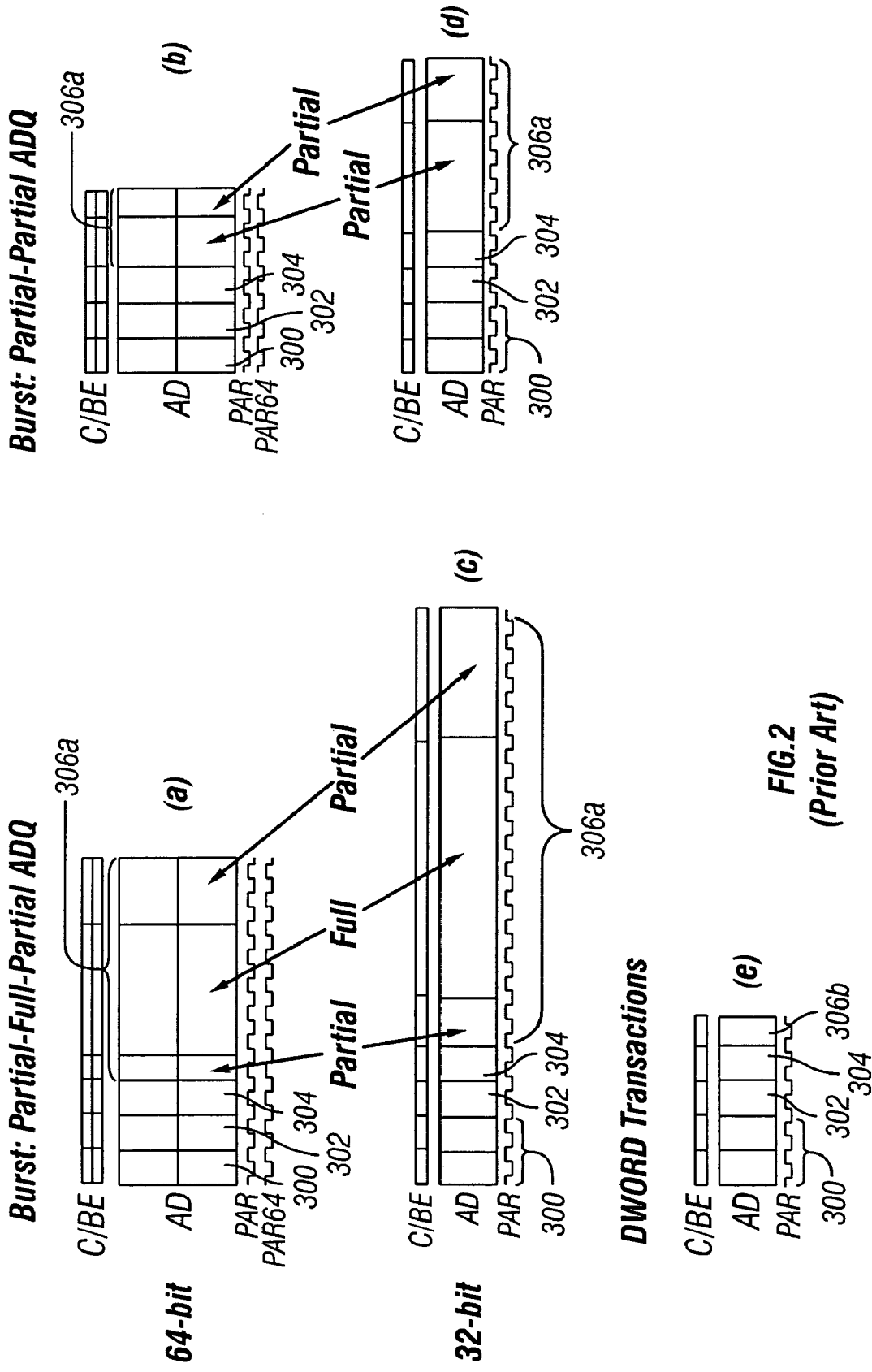
FIG. 2 illustrates prior art PCI-X transaction phases showing 32- and 64-bit transaction packet formats corresponding to FIG. 1.

PCI-X transfers data in quanta of 128 bytes or less for each ADQ, and the CRC described below operates on these quanta. FIG. 2 illustrates prior art PCI-X transaction phases showing 32- and 64-bit transaction packetized formats, corresponding to FIG. 1. "Full" in FIG. 2 indicates the full 128-byte ADQ and "partial" indicates less than a 128-byte full ADQ delimited only on one end by an ADB. As indicated in FIG. 2, burst transactions can transfer data on any number of data phases, from one up to the maximum number required to satisfy the byte count. Burst transactions are permitted to be initiated both as 64-bit (FIGS. 2(a), 2(b)) and 32-bit (FIGS. 2(c), 2(d)) transactions. FIG. 2 shows both partial and full burst data transactions for both 64-bit and 32-bit transactions for a burst of a partial-full-partial ADQ and a burst of a partial-partial ADQ.

PAR and PAR64 (for 64-bit transfer-capable devices) are the parity commands for checking parity. Targets check parity for address and attribute phases, and the device receiving the data checks parity in data phases. On any given address and attribute phase, PAR and PAR64 are driven by the initiator. On any given data phase, PAR and PAR64 are driven by the device that drives the data. Parity checking occurs in the clock after PAR and PAR64 are valid. In all cases, the parity bits lag the corresponding address or data by one clock.

The PCI-X transaction packet formats are well known to those of skill in the art. FIG. 2(e) also shows the transaction format for a DWORD transaction. DWORD transactions always have a single data phase and affect no more than a single DWORD. DWORD transactions are permitted to be initiated only as lower bus half 32-bit transactions and do not use the AD or C/BE# upper bus halves (see FIG. 1) or the PAR64 bus (see FIG. 7), even when initiated by a 64-bit device.

In general, a PCI-X bus transaction or transfer consists of one or more address phases, an attribute phase, and any number of data phases (depending on whether a burst or DWORD transaction), as will be appreciated by those skilled in the art. Referring again to FIGS. 1 and 2, the PCI-X transaction phases are shown as a combination of phases. These phases are address phase 300 (e.g., Address phase 1 and Address phase 2), attribute phase 302, one or more clock phases 304 (also referred to as the target response phase, and occurs after the attribute phase), and data phase(s) 306 (306A for burst data phase(s) and 306B for a DWORD data phase), signaled by a single assertion or activation of FRAME# on the PCI-X bus, as will be appreciated by those skilled in the art. "DAC" in FIG. 1 indicates Dual Address Cycle command and "CMD" indicates command other than DAC, as also will be appreciated by those skilled in the art.

In accordance with embodiments of the present invention, the C/BE# lanes and the clock phase 304, immediately after the attribute phase 302, can be used together to carry CRC data for the data phase(s) 306 (i.e., 306A for burst and 306B for DWORD transactions). The address and attribute phases of a PCI-X transaction also can be covered by using the upper AD bus of the attribute phase 302 or clock phase 304 immediately after the attribute phase 302 to carry CRC check bits. In alternative embodiments, the PCI PAR64 and/or PAR can be used in place of the C/BE# lanes to carry CRC check-bits to cover the data phase(s) 306A of the transaction, thereby leaving the C/BE# lanes untouched. The CRC check-bits in the PAR signal can be used to carry up to 32-bits of CRC check-bit data. For 64-bit burst transactions, the PAR and PAR64 signals can be used to carry up to 32-bits of CRC check-bits. These embodiments will be described in more detail below.

For illustrative purposes, embodiments of the present invention will be described herein for computer systems using Intel Corporation microprocessor architectures. Accordingly, certain terms and references are specific to such processor platforms. PCI-X and the enhancements described herein according to embodiments of the present invention, however, are hardware independent, and may be used with any host computer designed for this interconnect standard. As will be appreciated by those skilled in the art of computer systems, embodiments of the present invention may be adapted and applied to any computer platform utilizing the PCI-X standard.

Figure 3:
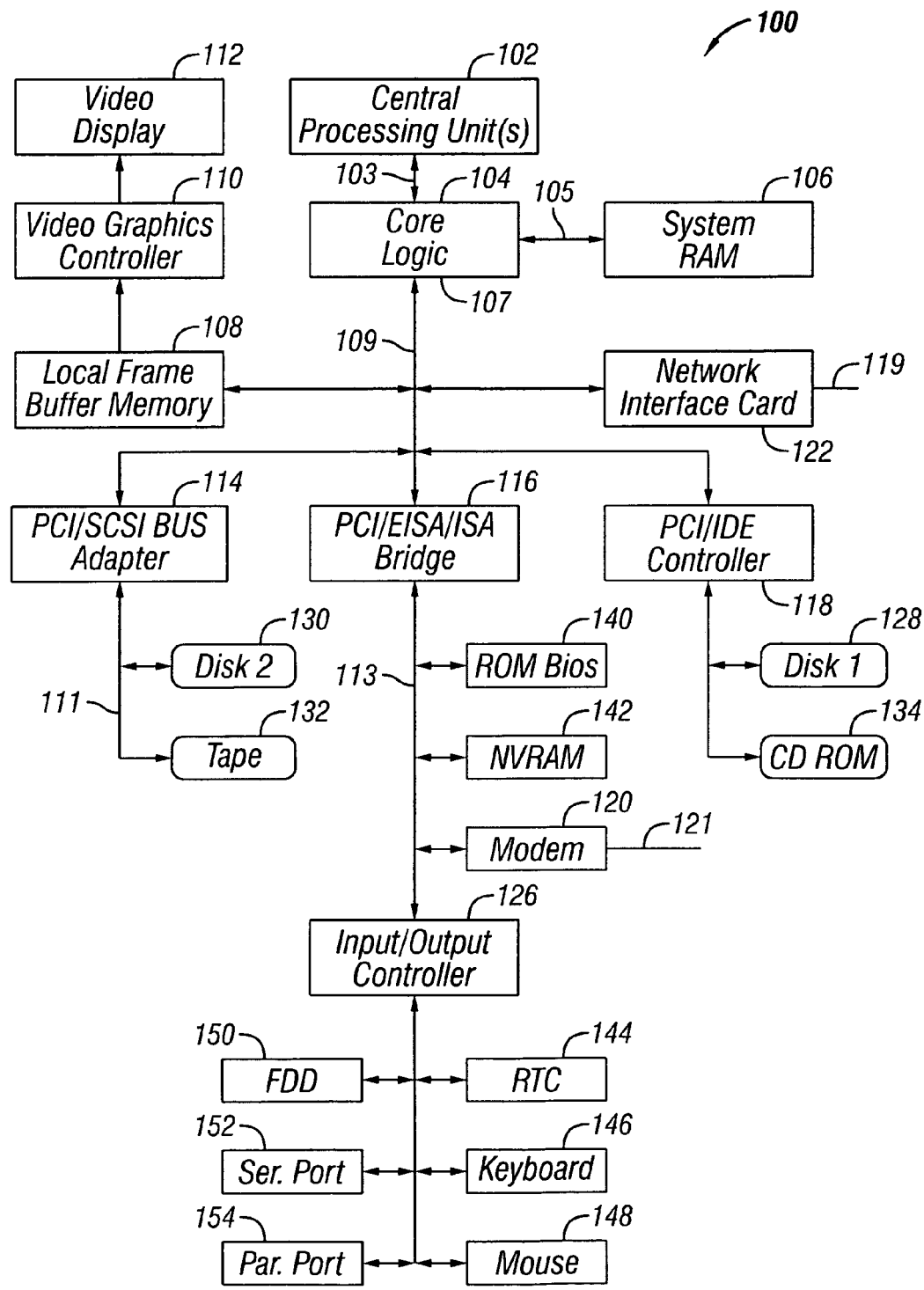
FIG. 3 is an exemplary schematic block diagram of a computer system, in accordance with an embodiment of the invention.

Referring to FIG. 3, an exemplary schematic block diagram of a computer system according to an embodiment of the present invention is illustrated. The computer system is indicated generally by the numeral 100 and includes central processing unit(s) (CPU) 102, core logic 104 ("North Bridge"), system random access memory (RAM) 106, a video graphics' controller 110, a local frame buffer 108, a video display 112, a PCI/SCSI bus adapter 114, a PCI/EISA/ISA bridge 116 ("South Bridge"), a PCI/IDE controller 118, and an optional network interface card (NIC) 122. Single or multilevel cache memory (not illustrated) may also be included in the computer system 100 according to the current art of microprocessor computer systems. The CPU 102 may be a plurality of CPUs 102 in a symmetric or asymmetric multi-processor configuration.

The CPU 102 is connected to the core logic 104 through a CPU host bus 103. The system RAM 106 is connected to the core logic 104 through a memory bus 105. The core logic 104 includes a host-to-PCI bridge between the host bus 103, the memory bus 105 and a PCI bus 109, as well as other components, as will be appreciated by those skilled in the art. More than one PCI bus is contemplated herein as well as PCI-to-PCI bridges (not illustrated), and is within the scope and content of embodiments of the present invention. The local frame buffer 108 is connected between the video graphics controller 110 and the PCI bus 109. The PCI/SCSI bus adapter 114, PCI/EISA/ISA bridge 116, PCI/IDE controller 118, and the NIC 122 are connected to the PCI bus 109. Some of the PCI devices, such as the video controller 110 and the NIC 122, may plug into PCI connectors on the computer system 100 motherboard (FIG. 4).

Hard disk 130 and tape drive 132 are connected to the PCI/SCSI bus adapter 114 through a SCSI bus 111. The NIC 122 may be connected to a local area network 119. The PCI/EISA/ISA bridge 116 connects over an EISA/ISA bus 113 to a ROM BIOS 140, nonvolatile random access memory (NVRAM) 142, modem 120, and input-output controller 126. The modem 120 connects to a telephone line 121. The input-output controller 126 interfaces with a keyboard 146, real time clock (RTC) 144, mouse 148, floppy disk drive (FDD) 150, serial port 152, and parallel port 154. The EISA/ISA bus 113 is a slower information bus than the PCI bus 109, but the cost is less to interface with it.

When the computer system 100 is first turned on, start-up information stored in the ROM BIOS 140 is used to begin operation thereof. Basic setup (BIOS) instructions are stored in the ROM BIOS 140 so that the computer system 100 can load more complex operating system (OS) software from a memory storage device, such as the disk 130. Before the operating system software can be loaded, however, certain hardware in the computer system 100 is configured to properly transfer information from the disk 130 to the CPU 102. In the computer system 100 illustrated in FIG. 3, the PCI/SCSI bus adapter 114 is configured to respond to commands from the CPU 102 over the PCI bus 109 and transfer information from the disk 130 to the CPU 102 via buses 109 and 103. The PCI/SCSI bus adapter 114 is a PCI device and remains platform independent. Therefore, separate hardware independent commands may be used to set up and control any PCI device in the computer system 100. These hardware independent commands, however, are located in PCI BIOS contained in the computer system ROM BIOS 140. The PCI BIOS is firmware that is hardware specific but meets the general PCI specification. Plug and play and PCI devices in the computer system are detected and configured when a system configuration program is executed. The results of the plug and play and PCI device configurations are stored in the NVRAM 142 for later use by the startup programs in the ROM BIOS 140 and the PCI BIOS that configure the necessary computer system 100 devices during startup. Also during startup a built-in-self-test (BIST) may perform diagnostic testing of components, such as PCI devices, in the computer system.

Figure 4:
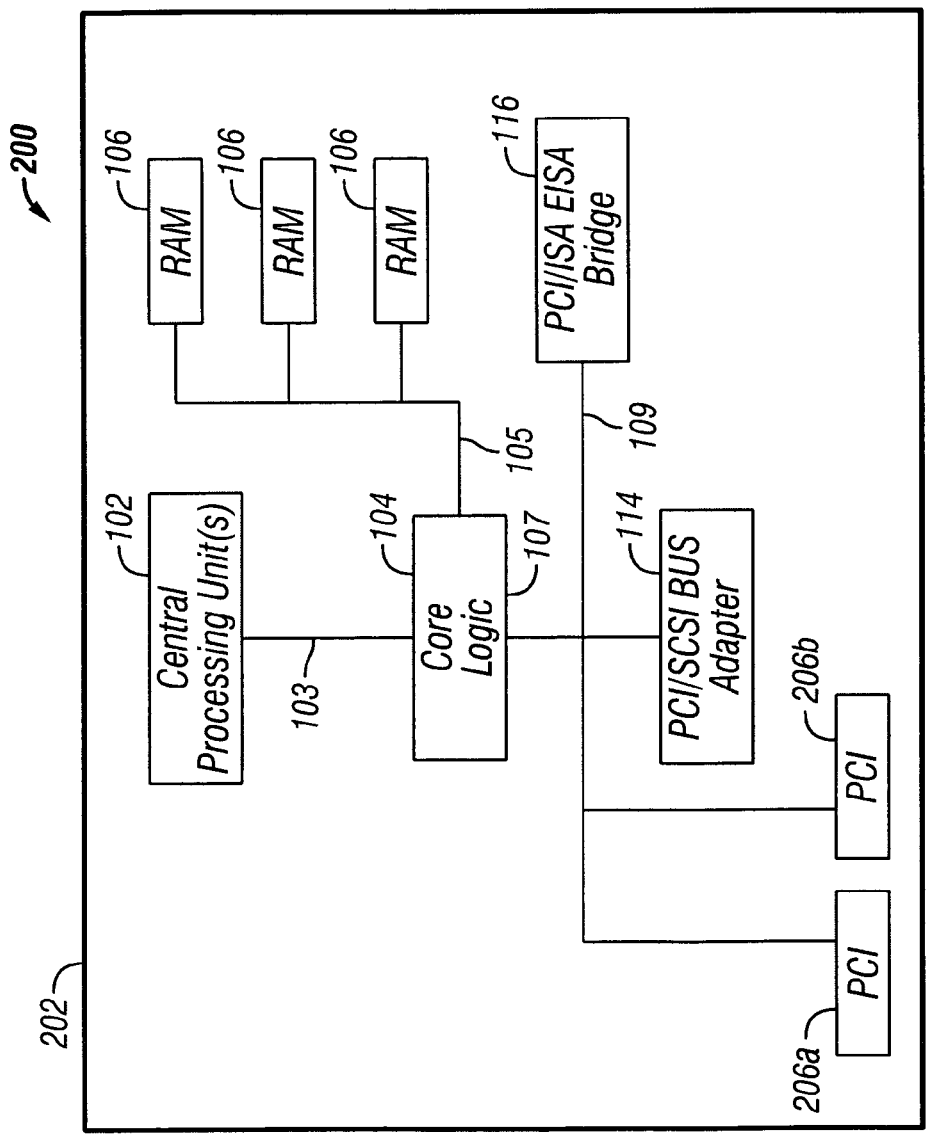
FIG. 4 is an exemplary schematic diagram of a printed circuit motherboard of the computer system of FIG. 1.

Referring to FIG. 4, a schematic diagram of an exemplary computer system motherboard 200 according to FIG. 3 is illustrated. The computer system motherboard 200 includes printed circuit board 202, on which components and connectors are mounted. The printed circuit board 202 includes conductive printed wiring used to interconnect these components and connectors. The conductive printed wiring (illustrated as buses 103, 105 and 109) may be arranged into signal buses having controlled impedance and signaling characteristics. Illustrated on the printed circuit board 202 are the core logic 104, CPU(s) 102, RAM 106, embedded PCI/ISA/EISA bridge 116, embedded PCI/SCSI bus adapter 114, and PCI connectors 206a, 206b (connectors are the same for PCI and PCI-X). The motherboard 200 may be assembled into a case (not illustrated) with a power supply, disk drives, etc., which form the computer system 100 of FIG. 3.

Embodiments of the present invention enhance the operation of computer systems, such as the computer system 100 in FIGS. 3 and 4, which use PCI-X buses, and provide logic circuits and signal protocols thereof. These embodiments provide support for up to 32-bits of CRC check-bits for 64-bit burst or a DWORD transaction payload, or support for up to 16-bits of CRC check-bits for a 32-bit burst transaction payload. In addition, up to 32-bits of CRC check-bits for header portions (address and attribute) of PCI-X transactions on the PCI-X bus can also be supported in the computer system of FIGS. 3 and 4. Such support could be implemented in a variety of other computer systems as well. CRC support also can be made optional in such systems. According to embodiments of the present invention, a CRC algorithm can be incorporated into all PCI-X compatible devices (e.g., in ASICs or other logic in each target and initiator) of FIGS. 3 and 4, as will be appreciated by those skilled in the art, to generate and/or decode the CRC check-bits. Any CRC algorithm using up to 32-bits of check-bits to cover up to 128 bytes of data is contemplated, as will be appreciated by those skilled in the art. The present invention is not limited to any particular or particular type of CRC algorithm.

By adding CRC check-bits in the reserved or RDH fields of the transaction, for example, adding two 32-bit CRC check-bit sequences in the clock immediately after the attribute phase (or target response phase), these CRC sequences can be used to cover the first and second ADQ quanta (i.e., partial or full ADQ, 1-128 bytes). If the transaction has more than two ADQ quanta, then the CRC check-bits also can be carried on the C/BE# lanes, or in the PAR and/or PAR64 command signals for the "next" or subsequent ADQ quanta. These protocol changes allow CRC to be supported on PCI-X for all combinations of payload, transfers (DWORD or burst), and negotiated bus widths. If needed, CRC also could cover the header information by adding CRC check-bits in the upper bus portion of the attribute phase. Note that if the target response phase 304 is used to carry CRC check bits, then Memory Read Immediate transactions will likely not support decode speed "A" according to the PCI-X specification as a result of the clock after the attribute phase being used for the AD bus turnaround.

Figure 5:
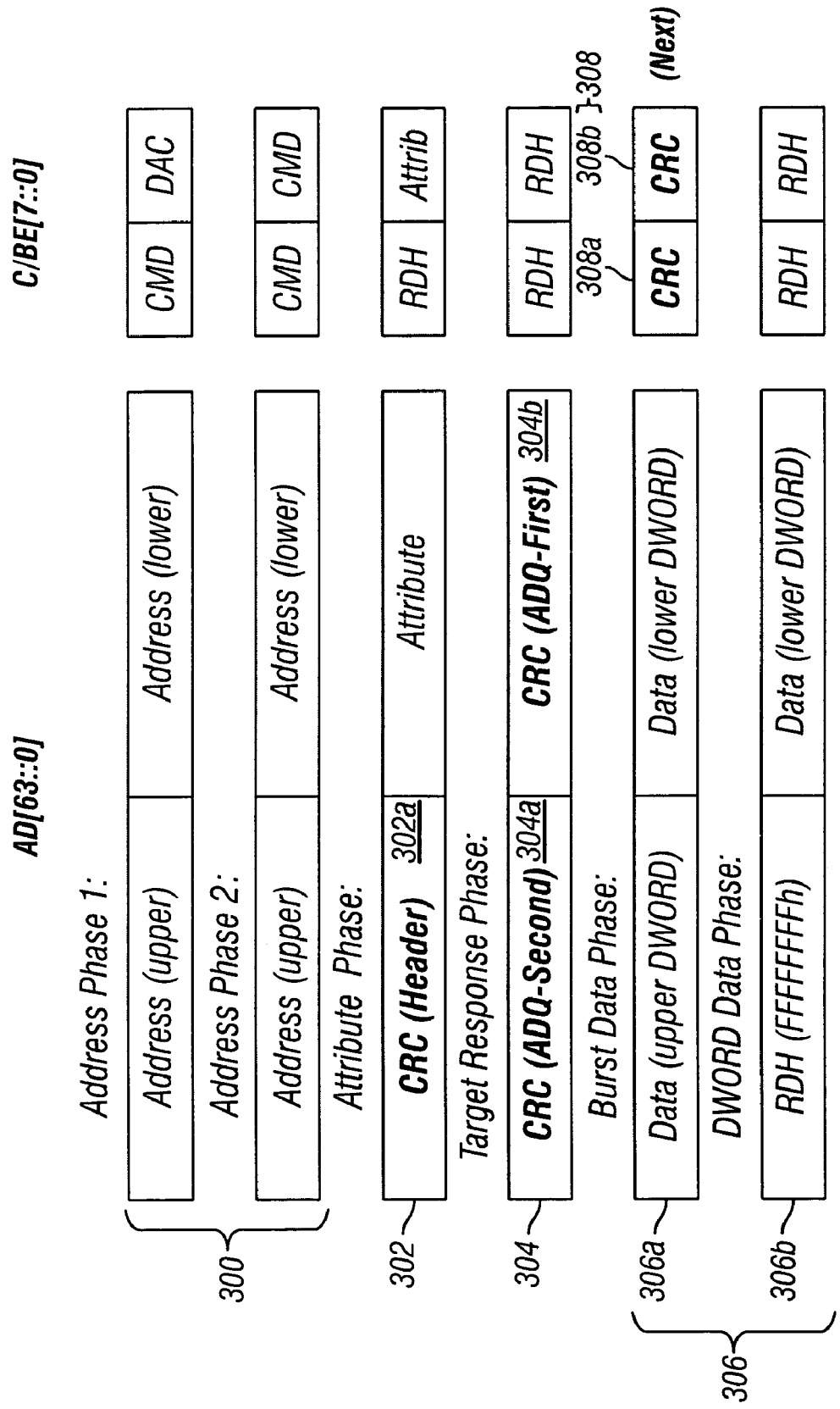
FIG. 5 illustrates all (32-bit and 64-bit) transaction phases for PCI-X with an exemplary CRC check-bit allocation, in accordance with embodiments of the invention.

Referring to FIG. 5, all (32-bit and 64-bit) transaction phases for PCI-X are shown, including the reserved (and RDH) bits similar to FIG. 1, except with an exemplary CRC check-bit allocation, in accordance with embodiments of the invention. Such transaction phases could be associated with transactions on the PCI-X bus 109 of FIGS. 3 and 4, according to the PCI-X protocol. In FIG. 5, the upper half of the AD lanes is referred to as AD[63:32] and the lower half of the AD lanes is referred to as AD[31:0], as will be appreciated by those skilled in the art. Also in FIG. 5, 32-bit CRC check-bits, for example, are inserted in the upper half 302A of the attribute phase 302, and in the upper half 304A and the lower half 304B of the clock (or target response) phase 304 in the AD lanes, where unused RDH bits would otherwise be located in the full PCI protocol (see FIG. 1). These CRC check-bits can be used for error detection in the header address and attribute information. The 32-bit CRC check-bits in the upper half 302A of the attribute phase 302 cover error detection in the header (i.e., the address 300 and attribute 302 phases) of 64-bit transactions.

The data phase(s) 306 in the transaction will be either one or more burst data phases 306A or a single DWORD data phase 306B, as indicated above and as will be appreciated by those skilled in the art. For simplicity of illustration, both types are shown in FIG. 5. For one or more burst data phases 306A, the CRC check-bits, up to 32-bits, shown in the lower bus half 304B in FIG. 5 in the AD lanes and labeled "ADQ-First" covers the first (i.e., from 1-128 bytes) ADQ. The CRC check-bits, up to 32-bits, in the upper bus half 304A and labeled "ADQ-Second" can cover the second ADQ. Up to 32-bits of CRC check-bits can be carried in the reserved C/BE#[7:0] bus (308A and 308B) for 64-bit burst transactions (a minimum of 4 clocks to transfer) or on the C/BE#[3:0] (308A) bus for 32-bit burst transactions (a minimum of 8 clocks to transfer). The C/BE# lanes of the current ADQ will therefore be used to build the full CRC check-bits, to cover all subsequent ADQ (labeled as "next"). Like burst transactions, all DWORD transactions (inclusive of I/O and configuration transactions), which transfer only a single DWORD data phase (306B), can support up to 32-bits of CRC check-bits in 304B to cover the DWORD of data.

Figure 6:
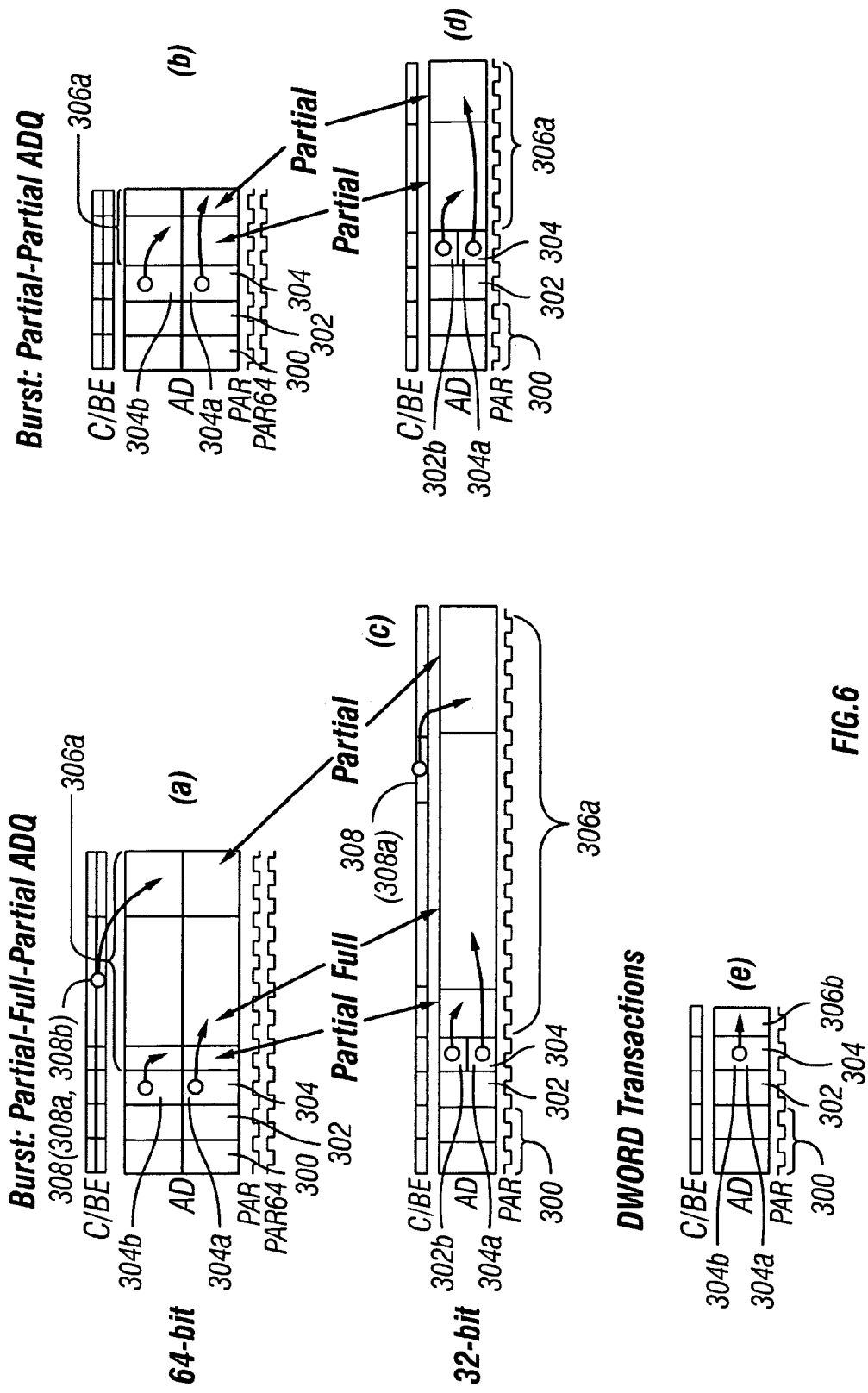
FIG. 6 illustrates PCI-X transaction phases showing 32-bit and 64-bit transaction packet formats corresponding to an exemplary implementation of the transaction phases of FIG. 5, including CRC check-bits, in accordance with embodiments of the invention.

An exemplary embodiment of a CRC allocation is shown in FIGS. 6(a), (b) or (e), which represents just one possible implementation showing the 32-bits of CRC check-bits for 64-bit burst or DWORD transactions shown in FIG. 5. FIGS. 6(c) or (d) represent just one possible implementation showing the 16-bits of CRC check-bits for 32-bit burst transactions shown in FIG. 5. FIG. 6 is similar to FIG. 2, except the 32-bits of CRC check-bits are inserted in various PCI-X phase locations. In particular, as shown in FIG. 6(a) for a 64-bit burst partial-full-partial ADQ, CRC check-bits are inserted into the target response phase 304 (the clock immediately after the attribute phase). The inserted 32-bits of CRC check-bits are represented by blackened circles, with arrows that point to the particular phases and ADQ for which these CRC check-bits provide coverage. In FIG. 6(a) as in FIG. 2, three burst data phases are shown, two being partial ADQ data phases, which surround a full 128-byte ADQ data phase. The CRC check-bits in the upper bus half 304A of the target response phase are shown covering the full ADQ data phase, the second ADQ of the burst data phase 306A. Similarly, the up to 32-bits of CRC check-bits in the lower bus half 304B of the target response phase 304, the clock immediately after the attribute phase, are shown covering the first partial ADQ data phase, the first ADQ of the burst data phase 306A. CRC check-bits also are shown in the C/BE# lanes in the upper 308A and lower 308B bus halves 308, as in FIG. 5. The CRC check-bits in the upper 308A and lower 308B bus halves 308 are shown covering the second partial ADQ burst data phase, the subsequent ADQ after the first two ADQ in the AD lanes. A similar CRC check-bit coverage is shown for the burst partial-partial ADQ in FIG. 6(b), except no CRC check-bits are needed for beyond the first two (in this case, partial) ADQ as they are in FIG. 6(a). For 32-bit burst ADQ transactions, as illustrated in FIG. 6(c) in the clock (or target response) phase 304, the first two (e.g., partial and full) ADQ are covered each by up to 16-bits of CRC check-bits allocated from the available 32-bits in phase 304, as indicated by the horizontal line. In FIG. 6(c), one of the RDH 4-bit halves 308 (e.g., 308A) of the C/BE# lanes includes CRC check-bits to cover the third (e.g., partial) and all subsequent ADQ if included in the transaction after the second (full) ADQ of the data phases 306A. Also, analogous coverage to that shown in FIG. 6(c) is provided by the CRC check-bits shown in FIG. 6(d) for a 32-bit burst partial-partial ADQ transaction with PCI-X, except only two partial ADQ data phases require coverage, as in FIG. 6(b), in the disclosed embodiment.

FIG. 6(e) similarly shows a CRC check-bit allocation for a 32-bit DWORD transaction. Again, the target response phase 304 carries up to 32-bits of CRC check-bits to cover the DWORD data phase 306B. As will be appreciated by those skilled in the art, different allocations of CRC check-bits in the normally reserved or RDH portions of the AD and/or C/BE# lanes, or in the PAR and/or PAR64 lanes (described below) can be made in other embodiments to cover all ADQ or all ADQ and the header (i.e., full coverage), whether or not the ADQ are partial or full, in PCI-X. For example, FIG. 5 shows CRC check-bits that cover the ADQ and the header while FIGS. 6(a)-6(d) only show coverage for the ADQ for simplicity of illustration. These other embodiments are included in the scope and spirit of the present invention. Those skilled in the art will appreciate how to modify FIG. 6 to accommodate CRC check-bits to cover the header.

Although FIG. 5 shows the header CRC check-bits only inserted into an unused (RDH) portion of the upper half 302A of the attribute phase 302, it is to be understood that the check-bits for ADQ or for ADQ and the header could be inserted into any unused fixed attribute bits, or in the undefined AD bits in the clock phase 304 after the attribute phase 302, or in any other RDH portions of the AD and/or C/BE# lanes and/or PAR or PAR64 (described below) of the PCI-X phases (i.e., in any of the unused RDH or other bits). Alternatively, the CRC check-bits could be multiplexed with any other bits used in PCI-X, in accordance with other embodiments of the invention, as will be appreciated by those skilled in the art. However, a usage model that inserts header CRC check-bits on the AD bus in the clock after the attribute phase 302 will not likely support PCI-X decode speed "A" for Memory Read Immediate transactions, as indicated above. The data phase 306 of Memory Write commands, which uses the C/BE# lanes to carry byte enables, as a result, are not available for CRC check-bits. It should be noted that by using the PAR and/or PAR64 signals instead, this problem can be resolved. The data phase 306 of the Memory Read (Immediate Only) would require a protocol change if the CRC check-bits are carried on the C/BE# lanes because bus ownership must turnaround and would therefore make CRC not interoperable with PCI-X 1.0. It should be noted that by using the PAR and/or PAR64 signals instead, this problem also can be resolved.

A PCI-X device that supports CRC both generates the CRC and checks for errors in the ADQ or in the ADQ and the header. In certain embodiments, as will be appreciated by those skilled in the art, such a device can use a PCI-X Status Register CRC Capable bit (e.g., bit 23) located in the status register in the device configuration space to indicate its support of CRC. Also, in certain embodiments, also as will be appreciated by those skilled in the art, CRC generation and checking logic may only be activated when a PCI-X command register CRC Enable bit (e.g., bit 20) in the status register is enabled.

Figure 7:
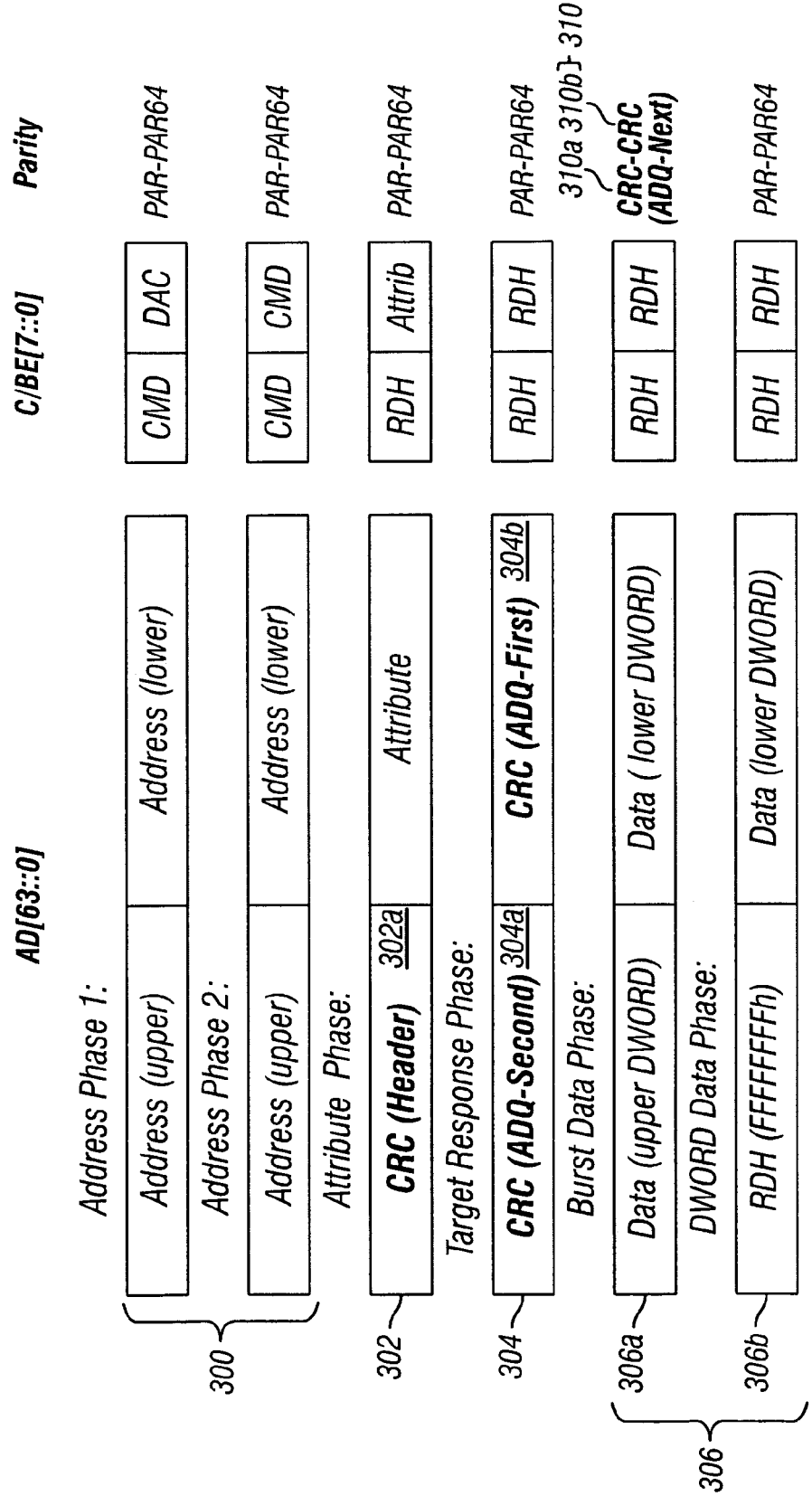
FIG. 7 illustrates all (32-bit and 64-bit) transaction phases for PCI-X with an exemplary CRC check-bit allocation, in accordance with embodiments of the invention.

FIG. 7 illustrates all 32-bit and 64-bit transaction phases for PCI-X showing the AD lanes, C/BE# lanes, and parity lanes (for generation and checking), with an exemplary CRC check-bit allocation, including in the PAR and PAR64 command signals, in accordance with embodiments of the invention. FIG. 7 is similar to FIG. 5, and the description of the implementation of the CRC check-bit allocation in FIG. 5 given above is the same as for FIG. 7, except that instead of providing for CRC check-bit coverage of a "Next" or subsequent ADQ in the C/BE# lanes, such coverage is provided in the parity lanes. For example, as shown in the parity lanes in FIG. 7, the CRC check-bits may be inserted on PAR and/or PAR64 (for a 64-bit device) signals in the data phase 306, shown as 310A and 310B, respectively, to cover all subsequent additional ADQ after the second ADQ, if necessary (see FIGS. 8 and 6). For 32-bit devices, only PAR is available in a similar circumstance, and not PAR64.

Figure 8:
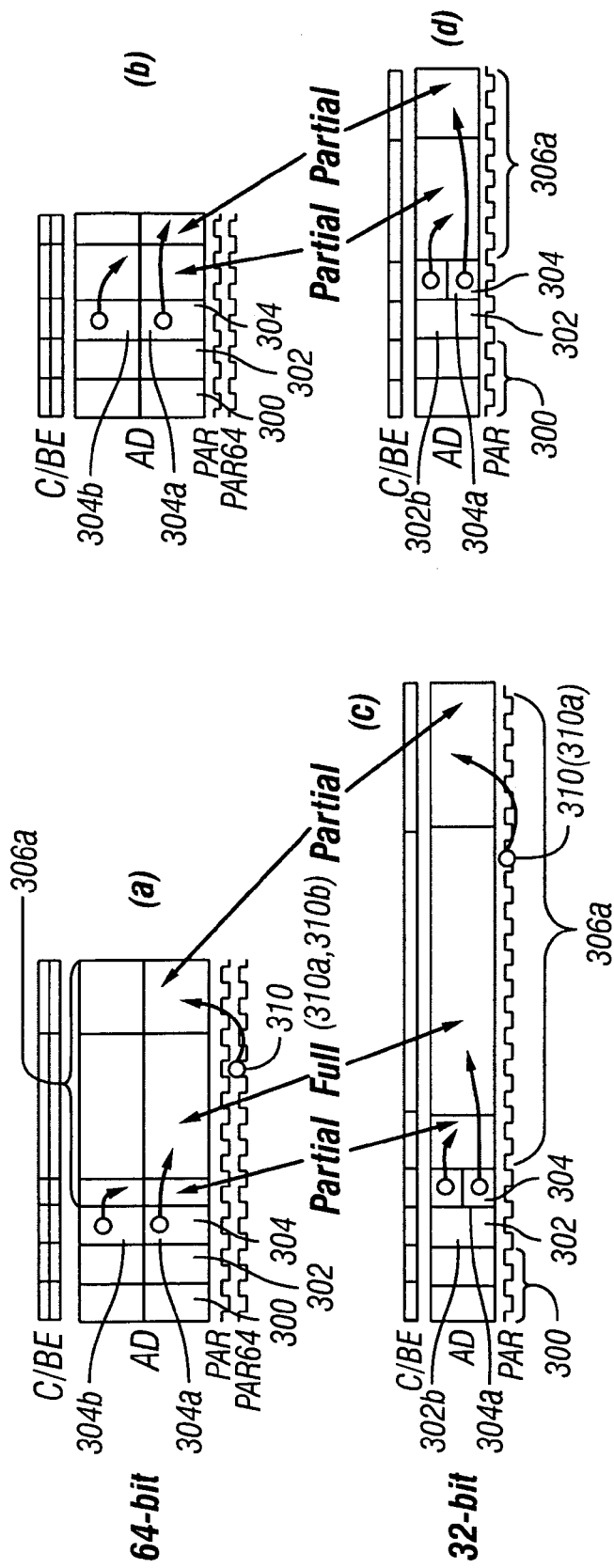
FIG. 8 illustrates PCI-X transaction phases showing 32-bit and 64-bit transaction packet formats corresponding to an exemplary implementation of the transaction phases of FIG. 7, including CRC check-bits, in accordance with embodiments of the invention.
Figure 8:
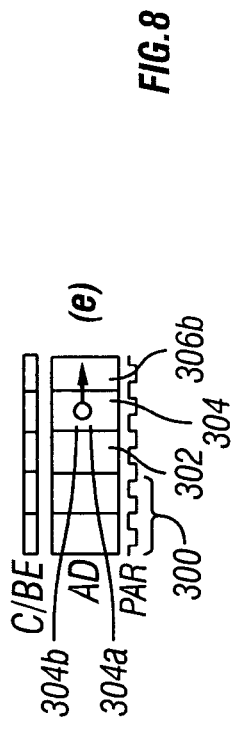

FIG. 8 illustrates, as FIG. 6 is to FIG. 5, an exemplary embodiment of a CRC allocation, which represents just one possible implementation of the CRC check-bits shown in FIG. 7. The description of FIG. 6, as given above, is the same for FIG. 8, except that CRC check-bits are inserted on PAR (310A) and PAR64 (310B) (for 64-bit devices) signals, as shown in FIG. 8(a), instead of in the C/BE# lanes, as in FIG. 6(a). The blackened circle and arrow in PAR (310A) and PAR64 (310B) schematically show that CRC check-bit coverage is provided for the subsequent (i.e., "ADQ-Next") ADQ quanta (e.g., second partial) after the second ADQ in FIG. 8(a) for a 64-bit device burst partial-full-partial ADQ transaction. In FIG. 8(c), CRC check-bits are shown, for a 32-bit transaction, inserted on PAR (310A) bits for covering the subsequent (i.e., "ADQ-Next") ADQ quanta after the second ADQ analogous to the coverage provided in the C/BE# lanes in FIG. 6(c). The remaining portions of FIG. 8 have the same description on as that of the analogous portions of FIG. 6 above. Note that transactions with only one or two ADQ quanta, whether full or partial, have no need for CRC check-bits on the PAR (310A) or PAR64 (310B), which include 32-bit burst partial-partial transactions (FIG. 8(d)).

Note that embodiments of the present invention require no additional pins to be supported on any PCI-X device and, as a result, are fully backward compatible with PCI-X, support both non-CRC- and CRC-capable devices dynamically as well as transparently to the system software. In summary, embodiments of the present invention provide more robust error detection in PCI-X using CRCs for all 32-bit and 64-bit transactions, all done seamlessly by hardware with no impact to software.

The foregoing disclosure and description of the preferred embodiment are illustrative and explanatory thereof, and various changes in the components, circuit elements, circuit configurations, signals, and signal connections, as well as in the details of the illustrated circuitry and construction and method of operation may be made without departing from the spirit and scope of the invention.,

I claim:

1. A method, in a computer system, of providing cyclic redundancy code (CRC) for extended peripheral component interconnect PCI-X, the method comprising:
   inserting CRC check-bits into either unused portions or into parity signals of a plurality of PCI-X phases for providing an error detection mechanism for PCI-X.

2. The method of claim 1, wherein the inserting comprises inserting the CRC check-bits into a PCI-X phase after a PCI-X attribute phase of the plurality of PCI-X phases.

3. The method of claim 1, wherein the inserting comprises inserting the CRC check-bits into a clock phase after an attribute phase of the plurality of PCI-X phases.

4. The method of claim 1, wherein the inserting comprises inserting the CRC check-bits into a PCI-X data phase of the plurality of PCI-X phases.

5. The method of claim 1, wherein the inserting comprises inserting the CRC check-bits into a lower half of PCI-X C/BE# portion of the plurality of PCI-X phases.

6. The method of claim 1, wherein the inserting comprises inserting the CRC check-bits into an upper half of PCI-X C/BE# portion of the plurality of PCI-X phases.

7. The method of claim 1, wherein the inserting comprises inserting the CRC check-bits into an upper portion of a PCI-X attribute phase of the plurality of PCI-X phases.

8. The method of claim 1, wherein the inserting comprises inserting the CRC check-bits into an unused PCI-X reserved drive high portion of the plurality of PCI-X phases.

9. The method of claim 1, wherein the inserting comprises inserting the CRC check-bits into an upper half of PCI-X AD portion of the plurality of PCI-X phases.

10. The method of claim 1, wherein the inserting comprises inserting the CRC check-bits into a lower half of PCI-X AD portion of the plurality of PCI-X phases.

11. The method of claim 1, wherein the inserting comprises inserting the CRC check-bits into a PCI-X AD portion of the plurality of PCI-X phases.

12. The method of claim 1, wherein the inserting the CRC check-bits does not disturb full backward compatibility with PCI-X.

13. The method of claim 1, wherein the inserting comprises inserting the CRC check-bits on a parity lane of the plurality of PCI-X phases.

14. The method of claim 1, wherein the inserting comprises inserting the CRC check-bits on one or both of PAR and PAR64.

15. The method of claim 1, further comprising transferring the CRC check-bits across an interconnect in the computer system to a peripheral device.

16. The method of claim 15, wherein the peripheral device is a CRC compatible device, and wherein the transferring comprises transferring the CRC check-bits across the interconnect in the computer system to the CRC compatible device.

17. The method of claim 15, wherein the peripheral device is a CRC incompatible device, and wherein the transferring comprises transferring the CRC check-bits across the interconnect in the computer system to the CRC incompatible device.

18. The method of claim 1, further comprising using a PCI-X Status Register CRC Capable bit in a device's configuration space in the computer system for indicating support of CRC.

19. The method of claim 1, further comprising activating CRC generation and checking logic in the computer system when a PCI-X command register CRC Enable bit is enabled.

20. The method of claim 1, further comprising covering ADQ of other portions of the plurality of PCI-X phases with the check-bits.

21. A method, in a computer system, of providing cyclic redundancy code (CRC) for extended peripheral component interconnect PCI-X, the method comprising:
   inserting CRC check-bits into unused portions or parity signals of a plurality of PCI-X phases for providing an error detection mechanism for PCI-X, wherein the inserting comprises inserting a first CRC check-bit portion into a first AD portion for covering a first PCI-X phase portion of the plurality of PCJ-X phases and a second CRC check-bit portion into a second AD portion for covering a second PCI-X phase portion of the plurality of PCI-X phases.

22. A computer system comprising:
   a central processing unit connected to a host bus;
   a random access memory connected to a system memory bus;
   an extended peripheral component interconnect (PCI-X) bus operating according to a PCI-X protocol;
   a core logic chip coupled as a first interface bridge between the host bus and the system memory bus, as a second interface bridge between the host bus and the PCI-X bus, and as a third interface bridge between the system memory bus and the PCI-X bus;
   a PCI-X device coupled to the PCI-X bus, the PCI-X device operating according to the PCI-X protocol, the PCI-X device adapted to provide a plurality of PCI-X phases in a PCI-X transaction and insert cyclic redundancy checking (CRC) code check-bits into unused portions of the plurality of PCI-X phases.

23. The computer system of claim 22, wherein the CRC check-bits are inserted into an attribute portion of the plurality of PCI-X phases.

24. The computer system of claim 22, wherein the CRC check-bits are inserted into a lower half C/BE# portion of the plurality of PCI-X phases.

25. The computer system of claim 22, wherein the CRC check-bits are inserted into an upper half C/BE# portion of the plurality of PCI-X phases.

26. The computer system of claim 22, wherein the CRC check-bits are inserted into a lower half AD portion of the plurality of PCI-X phases.

27. The computer system of claim 22, wherein the CRC check-bits are inserted into an upper AD portion of the plurality of PCI-X phases.

28. The computer system of claim 22, wherein the CRC check-bits are inserted into an AD portion of the plurality of PCI-X phases.

29. The computer system of claim 22, wherein the plurality of PCI-X phases comprises an unused reserved drive high portion, and wherein the CRC check-bits are inserted into the unused reserved drive high portion.

30. The computer system of claim 22, wherein the inserted CRC check-bits do not disturb full backward compatibility with PCI-X.

31. The computer system of claim 22, wherein a PCI-X Status Register CRC Capable bit located in the PCI-X device's configuration space is adapted to indicate support of CRC.

32. The computer system of claim 22, wherein CRC generation and checking logic in the computer system is adapted to be activated when a PCI-X command register CRC Enable bit is enabled.

33. The computer system of claim 22, wherein the check-bits cover ADQ in other portions of the PCI-X phases.

34. The computer system of claim 22, wherein the check-bits are inserted without additional pins required on the PCI-X device.

35. A PCI-X system in a computer system comprising:
- means for inserting cyclic redundancy checking (CRC) code check-bits into one or more portions of one or more PCI-X phases; and
- means for detecting errors in one or more other portions of the one or more PCI-X phases using the CRC check-bits.

36. The PCI-X system of claim 35, wherein the one or more other portions of the one or more PCI-X phases comprises unused one or more portions of the one or more PCI-X phases.

37. The PCI-X system of claim 35, wherein the one or more other portions of the PCI-X phases comprises a header or a data phase.

38. The PCI-X system of claim 35, wherein the one or more other portions of the PCI-X phases comprises a burst or a DWORD transaction phase.

39. The PCI-X system of claim 35, wherein the one or more other portions of the PCI-X phases comprises a 32-bit transaction phase or a 64-bit transaction phase.

40. The PCI-X system of claim 35, wherein the CRC check-bits cover ADQ of the one or more portions of the one or more PCI-X phases.

* * * * *

UNITED STATES PATENT AND TRADEMARK OFFICE
CERTIFICATE OF CORRECTION

PATENT NO. : 7,447,975 B2  Page 1 of 1
APPLICATION NO. : 10/243995
DATED : November 4, 2008
INVENTOR(S) : Dwight D. Riley It is certified that error appears in the above-identified patent and that said Letters Patent is hereby corrected as shown below:

In column 1, line 28, delete "modem" and insert -- modern --, therefor.

In column 10, line 20, in Claim 21, delete "PCJ-X" and insert -- PCI-X --, therefor.

Signed and Sealed this

Fourth Day of August, 2009

JOHN DOLL
*Acting Director of the United States Patent and Trademark Office*